United States Patent [19]

Chari et al.

[11] Patent Number: 4,646,045

[45] Date of Patent: Feb. 24, 1987

[54] APERTURE SIZED DISC SHAPED END CAPS OF A FERROMAGNETIC SHIELD FOR MAGNETIC RESONANCE MAGNETS

[75] Inventors: Madabushi V. Chari, Burnt Hills; Ahmed K. Kalafala, Albany; John D'Angelo, Clifton Park; Michael A. Palmo, Jr., Ballston Spa, all of N.Y.

[73] Assignee: General Electric Company, Schenectady, N.Y.

[21] Appl. No.: 715,435

[22] Filed: Mar. 25, 1985

[51] Int. Cl.$^4$ .............................................. H01F 7/00
[52] U.S. Cl. ..................................... 335/301; 335/299; 324/320
[58] Field of Search ............... 335/211, 216, 299, 301; 324/318, 319, 320, 321

[56] References Cited

U.S. PATENT DOCUMENTS

| | | | |
|---|---|---|---|
| 3,008,044 | 11/1961 | Buchhold | 335/216 X |
| 3,924,210 | 12/1975 | Dionne | 335/211 |
| 4,233,583 | 11/1980 | Novacek | 335/236 |
| 4,340,770 | 7/1982 | Bridges et al. | 174/35 |
| 4,388,601 | 6/1983 | Sneed et al. | 324/318 X |
| 4,390,494 | 6/1983 | Salisbury | 324/319 X |
| 4,460,884 | 7/1984 | Post et al. | 336/73 |
| 4,471,333 | 9/1984 | Stephanides | 336/84 |
| 4,490,675 | 12/1984 | Knuettel et al. | 324/319 |
| 4,580,120 | 4/1986 | Jacquot | 335/301 |
| 4,584,549 | 4/1986 | Brown et al. | 335/301 |
| 4,587,490 | 5/1986 | Muller et al. | 324/319 X |
| 4,590,428 | 5/1986 | Muller et al. | 324/320 |
| 4,590,452 | 5/1986 | Ries et al. | 335/301 |
| 4,612,505 | 9/1986 | Zijlstra | 324/318 |

FOREIGN PATENT DOCUMENTS 2123639 9/1982 United Kingdom.

Primary Examiner—George Harris
Attorney, Agent, or Firm—William H. Steinberg; James C. Davis, Jr.; Paul R. Webb, II

[57] ABSTRACT

A shield for a MR magnet is provided comprising a cylindrical shell of magnetic material surrounding the MR magnet. The cylindrical shell is situated so that its longitudinal axis is coaxial with the magnetic axis of the MR magnet. Two disk shape end caps of magnetic material are secured to either end of the cylindrical shell. The end caps each define a central aperture extending longitudinally through the disk, with the radial extent of each of the apertures sized so that the perturbation of the field in the working volume of the MR magnet due to the cylindrical shell is compensated for.

8 Claims, 16 Drawing Figures

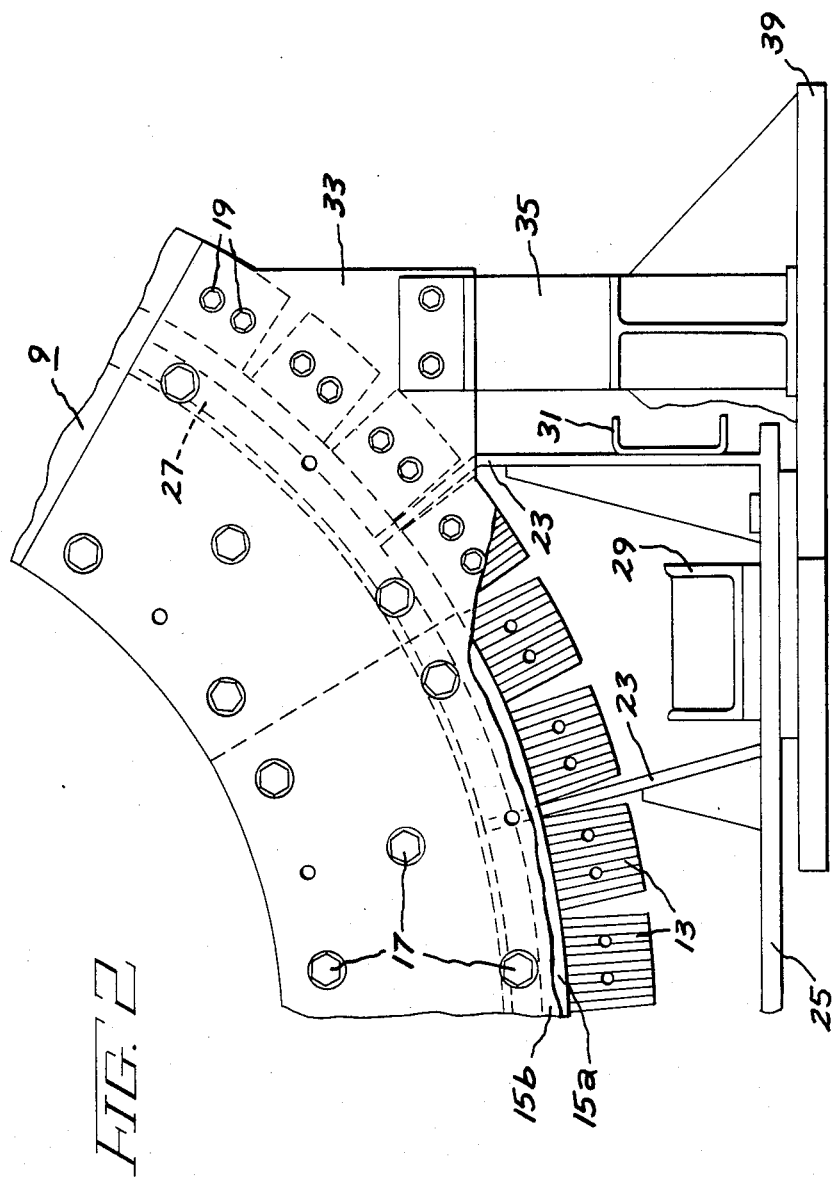

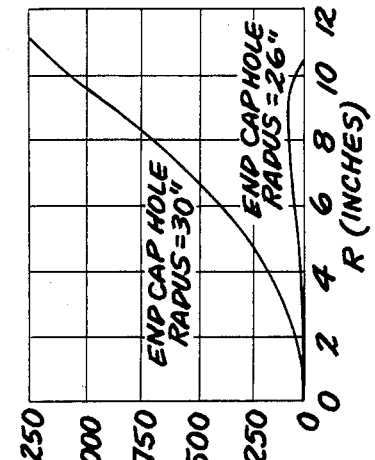
FIG. 6A
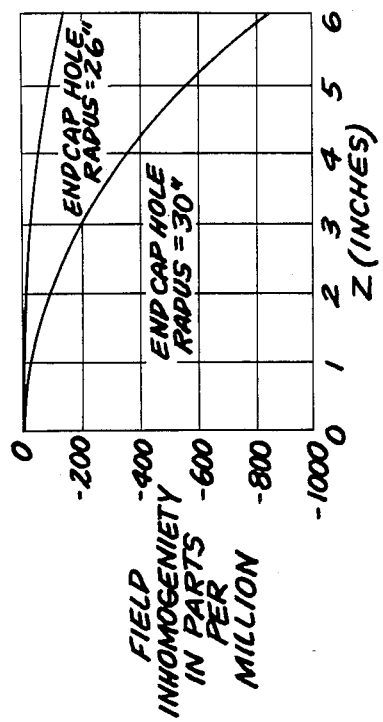
FIG. 6B
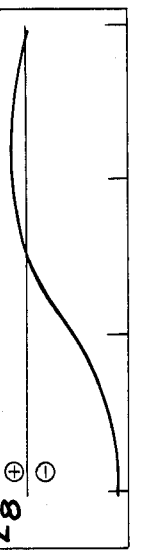
FIG. 5A EIGHTH SPHERICAL HARMONIC COFFICIENT
FIG. 5B SIXTH SPHERICAL HARMONIC COFFICIENT
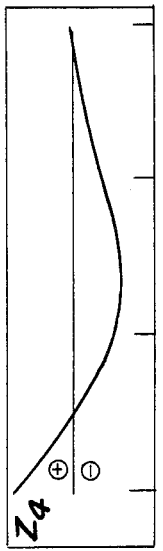
FIG. 5C FOURTH SPHERICAL HARMONIC COFFICIENT
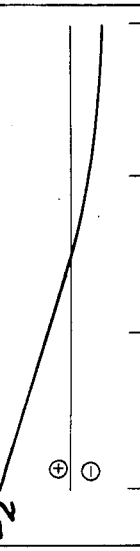
FIG. 5D SECOND SPHERICAL HARMONIC COFFICIENT

APERTURE SIZED DISC SHAPED END CAPS OF A FERROMAGNETIC SHIELD FOR MAGNETIC RESONANCE MAGNETS

BACKGROUND OF THE INVENTION

The present invention relates to a shield for reducing the stray fields in the vicinity of a magnetic resonance magnets.

Magnetic resonance (MR) magnets used in medical diagnostics generate high intensity dc magnetic fields. Installations of MR equipment, where practicable, is located in a separate building in an open area. In hospitals located in crowded metropolitan areas where space is at a premium, it is desirable to have as little disturbance to other hospital facilities as possible. Without special shielding a 50 foot area surrounding a 1.5 Tesla MR magnet (1 Tesla = 10 kilogauss) is needed to assure a minimum of interference with other diagnostic equipment and patients with cardiac pacemakers and neuro stimulators.

To reduce the space requirements, shielded rooms are erected surrounding the MR machines. The shielding has to be designed for the particular room shape and the shielding typically creates structural loading problems, since shielding can weigh 50 tons for a 1.5 T MR magnet.

Another concern with situating an MR magnet is the effect the surrouding structural environment has on the field homogeneity within the magnets working volume. A ferromagnetic body placed in the vicinity of an MR magnet will attract flux lines and this can be used to shield an external region from the stray field. However, the existence of the ferromagnetic body affects the distribution of flux lines throughout the space and will, therefore, affect the field homogeneity in the working volume. A nonuniform field in the working volume of the magnet is highly undesirable since it degrades the quality of the images produced by the MR machine.

It is an object of the present invention to provide an MR magnet shield to reduce the stray field using the least amount of ferromagnetic shield material.

It is a further object of the present invention to provide an MR magnet shield which uses the least amount of ferromagnetic shield material and at the same time minimizes the shield's effect on the field homogeneity in the working volume in the MR magnet.

It is a still further object of the present invention to provide an MR magnet shield suitable for retrofitting on the magnets of existing MR machines.

It is another object of the present invention to provide an MR magnet shield that desensitizes the magnet from the presence of ferromagnetic material in the vicinity of the MR magnet such as building structural supports.

It is another object of the present invention to reduce the attractive force on magnetizable object in the vicinity of the MR magnet, thereby reducing or eliminating the uncontrolled accelerating motion of these objects towards the MR magnet.

SUMMARY OF THE INVENTION

In one aspect of the present invention a shield for an MR magnet is provided comprising a cylindrical shell of magnetic material surrounding the MR magnet. The cylindrical shell is situated so that its longitudinal axis is coaxial with the magnetic axis of the MR magnet. Two disk shape end caps of magnetic material are secured to either end of the cylindrical shell. The end caps each define a central aperture extending longitudinally through the disk, with the radial extent of each of the apertures sized so that the perturbation of the field in the working area of the MR magnet due to the cylindrical shell is compensated for.

BRIEF DESCRIPTION OF THE DRAWINGS

While the specification concludes with claims particularly pointing out and distinctly claiming the present invention, the objects and advantages of the invention can be more readily ascertained from the following description of preferred embodiments when used in conjunction with the accompanying drawing in which:

FIG. 2 is a partial cutaway end view of the ferromagnetic shield and MR magnet of FIG. 1;

FIGS. 5A-D are graphs of the eighth, sixth, fourth and second spherical harmonic coefficients, respectively, at the origin of a shielded 0.8T MR magnet, plotted as a function of shield access hole radius for a 0.8T MR magnet;

FIGS. 6A and B are graphs showing field inhomogeneity for different size shield cap openings plotted as a function of the axial and radial dimensions, respectively;

FIG. 10 shows the perturbation of the working volume for the single and double shield configuration of FIG. 8.

DETAILED DESCRIPTION OF THE INVENTION

Figure 1:
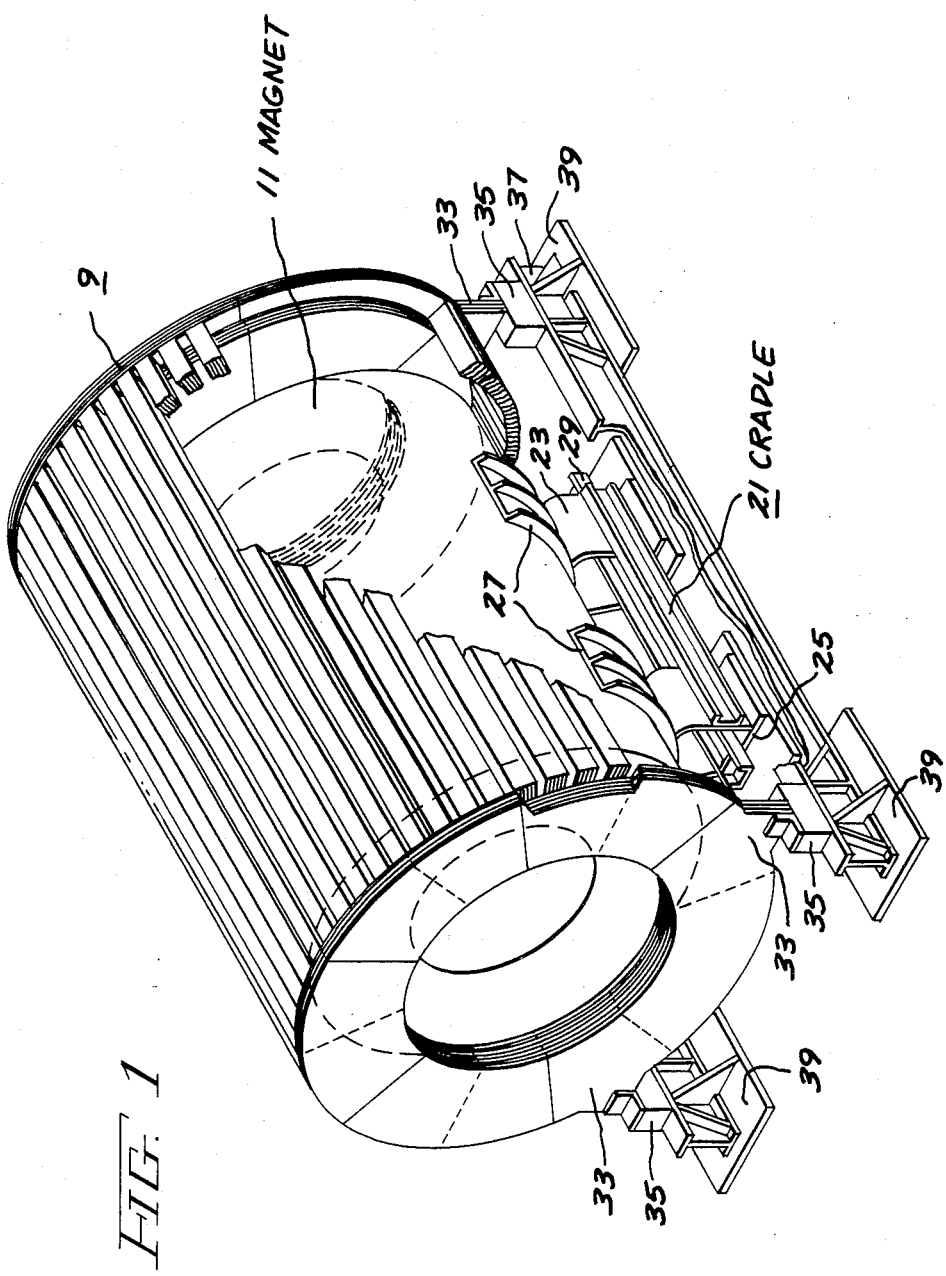
FIG. 1 is a partially cut away perspective view of one embodiment of a ferromagnetic shield surrounding an MR magnet in accordance with the present invention.

Referring now to the drawing wherein like reference numerals indicate like elements throughout, and particularly FIGS. 1 and 2 thereof, one embodiment of a shield 9 for an MR magnet is shown surrounding an MR magnet 11. The magnet can be of any type including resistive, low temperature, or superconducting. The shield comprises a cylindrical shell fabricated with staves 13 of magnetic material such as low carbon steel or ingot iron affixed to disk shaped end caps of magnetic material 15. Alternatively, the shell can be fabricated from rolled sheets welded together. Each stave comprises a plurality of half inch plates of magnetic material. The plates are joined together such as by tack welding with the plates arranged to conform with the curvature of the end caps. The ends of the staves are machined to assure a good fit with the end cap face. Each of the end caps 15 are made up of two segmented disks, a smaller diameter disk 15a and a larger diameter disk 15b concentrically joined to one another using bolts 17. The smaller and larger disk shaped end caps each comprise segments of magnetic material such as ingot iron or low carbon steel. The joints of the larger and smaller diameter disks staggered relative to one another. The larger diameter disk forms a flange extending around the periphery of the smaller diameter disk. Circumferentially arranged bolt holes extend axially through the larger diameter disk and align with tapped holes in the stave ends. The staves rest on the periphery of the smaller diameter disks and are securely joined to the inside faces of the larger disks using bolts 19. The disk shaped end caps define a central aperture extending longitudinally through the end caps. The diameter of the aperture is at least as great as the bore of the magnet 11 and does not interfere with access to the working space inside the bore of the magnet.

For a 1.5 Tesla superconducting magnet, an example of the shield geometry using ingot iron is:

| | |
|---|---|
| Inner radius of cylindrical shell | 1.1 meters |
| Axial length of cylindrical shell | 2.8 meters |
| Thickness of shell | .1 meters |
| Access hole radius in end cap | .71 meters |
| End cap thickness | .1 meters. |

Spacing from the exterior of the MR magnet to the inner diameter is approximately 10 centimeters.

The magnet 11 rests on two cradles 21 of nonmagnetic material such as austenetic stainless steel or aluminum. The two cradles are longitudinally spaced apart and situated under the cylindrical magnet. The cradle includes struts 23 which are welded between a base plate 25 and a saddle 27. The struts 23 extend between the staves 13 of the shield 9. Two longitudinally extending nonmagnetic channels 29 join the front and back base plates. The channels extend beyond the base plates of the cradles allowing vertical adjustment of the magnet relative to the shield. Two longitudinal channels 31 join the front and back strut portions on either side to allow for lateral adjustment of the magnet relative to the shield.

The lower segment of each of the large diameter end caps 15b each have two horizontally extending support sections 33, each of which are secured to a block of nonmagnetic material 35 such as by bolting. The blocks of material in turn rests on two longitudinally extending I beams 37. Each I beam supporting one side of each of the large diameter end plates. The I beams are each supported on either end on base plates 39 to spread the load of the shield.

The magnet is movable relative to the shield which is fixed. The magnet is adjusted so that the longitudinal axes of the magnet is coaxial with the magnetic axis of the MR magnet. The magnetic axis is defined as a line in space across which the flux density does not change.

The operation of the shield of FIG. 1 will now be explained. The stray field for a 1.5 Tesla MR magnet adjusted with compensating coils to achieve a uniform field in the working volume is shown in FIG. 3A. The MR magnet is a solenoidal type and the field is measured from the center of the working volume. The R direction extends radially from the center of the working volume of the magnet and the Z direction extends longitudinally from the magnet and also is measured from the center of the working space. A field strength of 1 gauss can cause interference with the operation of PET scanners, CT scanners and color televisions. A three gauss field can cause interference with the operation of metal detectors. A five gauss field can cause interference with the operation of cardiac pacemakers and neuro stimulators. A 10 gauss field can cause interference with the operation of x-ray tubes and the magnetic resonance scanners main computer and image processor. A 30 gauss field can cause interference with the remote console used with a magnetic resonance scanner. As a point of reference the earth's magnetic field is a 0.5 gauss.

A stray field reduction is achieved by surrounding the magnet with a shell of ferromagnetic material. The ferromagnetic material attracts lines of flux which reduce the amount of flux passing through the air outside the shield. The MR magnet provides a uniform dc field with the north and south poles at opposite axial ends of the magnets. Lines of flux pass from the north pole of the magnet radially through the end cap and then in the axial direction through the cylinder and radially through the opposite end cap to the south pole of the magnet. Other lines of flux pass directly into the shell and then in an axial direction and then back to the magnet. The gap between the stave ends and the flange is along the flux path, but since the stave ends are machined, leakage field is small. The leakage field can further be reduced using a filler material having suspended iron particles. The gaps between adjacent staves is not a problem since the flux does not flow circumferentially in the cylindrical shell. The shield magnetic material saturates in the presence of the magnetic field generated by the MR magnet.

Figure 3B:
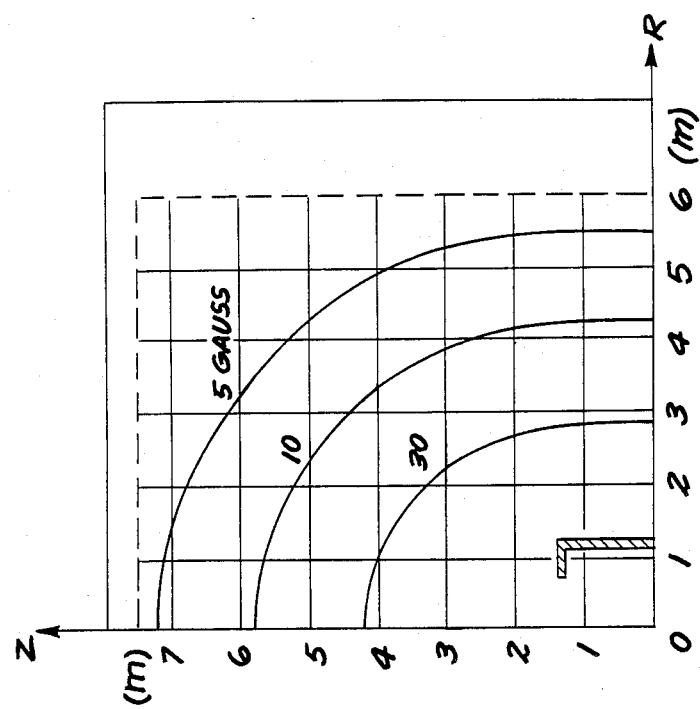
FIGS. 3A and 3B are graphs showing the stray field surrounding an unshielded 1.5 Tesla MR magnet and a 1.5 Tesla MR magnet shielded in accordance with the present invention, respectively.
Figure 3A:
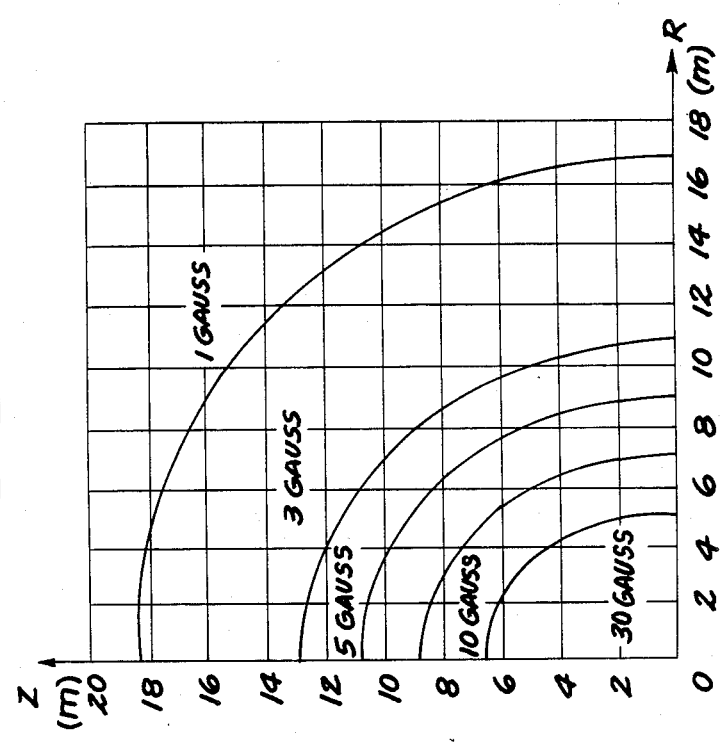

The graph of FIG. 3B shows the field in the axial and radial direction with the shield in place and the compensating coils adjusted for a uniform field. The shield saturates during operation of the magnet. The presence of the cylindrical shell reduces the stray field but at the same time introduces perturbations in the working volume.

Figure 4:
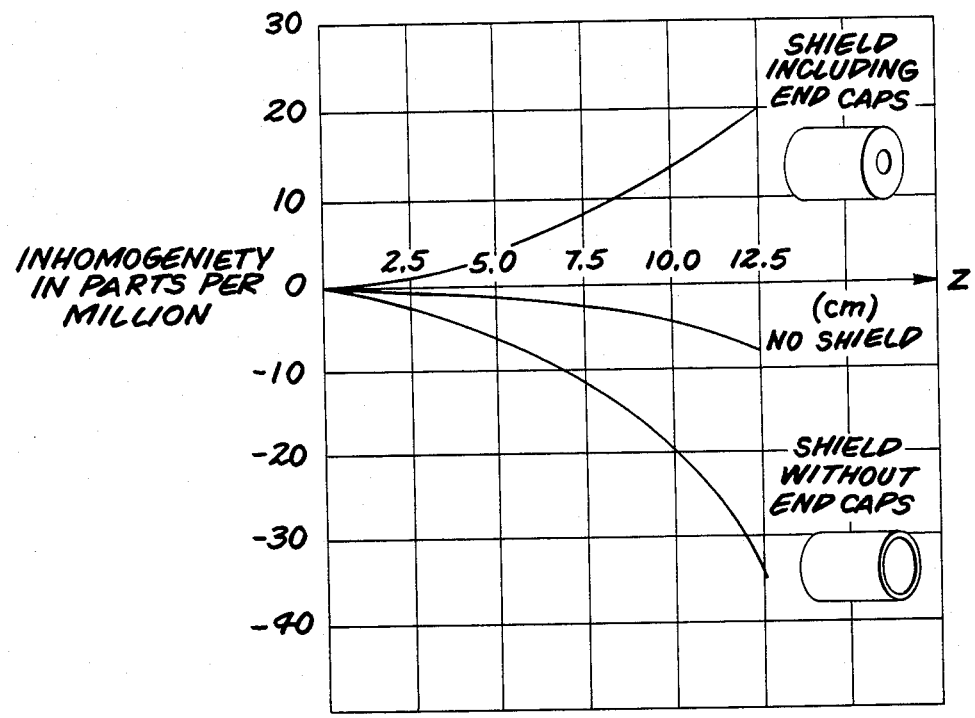
FIG. 4 is a graph showing field inhomogeneity in the working volume as a function of axial position for 1.5 Tesla MR magnet without a shield, a 1.5 Tesla magnet with a cylindrical shield without end caps and a 1.5 Tesla MR magnetic with a cylindrical shield with end caps, before any of the working fields have been corrected by adjusting coils.

Referring now to FIG. 4, it can be seen that the inhomogeneity of the field measured from the center of the working volume in the axial direction without the cylindrical shell and before the adjusting coils are used, worsens when the shield without the disk shaped end caps surround the magnet. The change in the inhomogeneity when the end caps are added, however, changes the polarity of the introduced inhomogeneity. The inhomogeneity is shown with end caps having an aperture less than the optimum size. It has been found that as the radius of the aperture increases, the inhomogeneity first decreases and then increases in the opposite direction to the limiting case of no end caps at all. Therefore, by properly adjusting the radial extent of the aperture, the perturbation introduced by the cylindrical shell alone can be compensated for. After the cylindrical shell and end caps have been installed around an MR magnet, final adjustments can be made by using adjusting coils in a manner similar to that used in setting up an MR magnet initially.

Since proper selection of the radius of the aperture can result in less inhomogeneity than without a shield, the ratings of the adjusting coils of the retrofitted machine can easily provide compensating currents in the adjusting coils within their originally designed capability.

Referring now to FIGS. 5A–D spherical harmonic coefficients at the origin of a shielded 0.8T MR magnet plotted as a function of the end cap openings. The shield around the MR magnet is 5 inches thick and does not saturate during magnet operation. The spherical harmonic coefficients when combined give the field inhomogeneity in the field. The odd harmonic coefficients cancel one another and the higher the even numbered coefficients generally the smaller contribution to the field inhomogeneity.

Referring now to FIGS. 6A and 6B field inhomogeneity in parts per million along the axis and radially, respectively, are shown for two end cap opening radii for a 0.8T MR magnet having a thickness of 5 inches. It can be seen that end cap opening of 26 inches minimizes field inhomogeneities along the magnet axis and in the radial direction. Referring back to the harmonic coefficients of FIGS. 5A–D and end cap radius of 26 inches is seen to minimize the sum of the harmonic coefficients at the origin. Thus whether or not the cylindrical shell with end caps is thick or thin, adjusting the radial extent of the end cap apertures can compensate for the perturbation of the field in the working area of the MR magnet due to the cylindrical shell.

Figure 7:
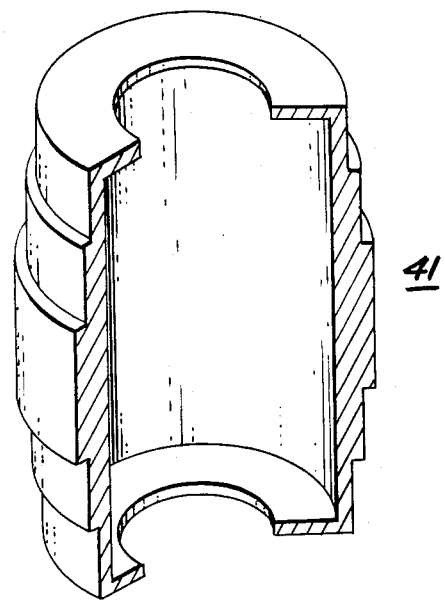
FIG. 7 is a perspective view of another embodiment of a ferromagnetic shield for an MR magnet in accordance with the present invention.

Referring now to FIG. 7, the total weight of the shield 41 can be minimized by ensuring that each part of the shield participates equally in diverting flux away from the external environment. This is achieved by having a variable thickness cylindrical shell. The shell thickness is thicker in the central portion, since more flux is carried in the shield in that section with a reduction in shell thickness in the portions of the shell further away from the center. The shield can be fabricated using staves comprising half inch ingot iron plates or low carbon steel plates having the desired profile and secured in the same manner as the plates shown in FIG. 1.

Figure 8A:
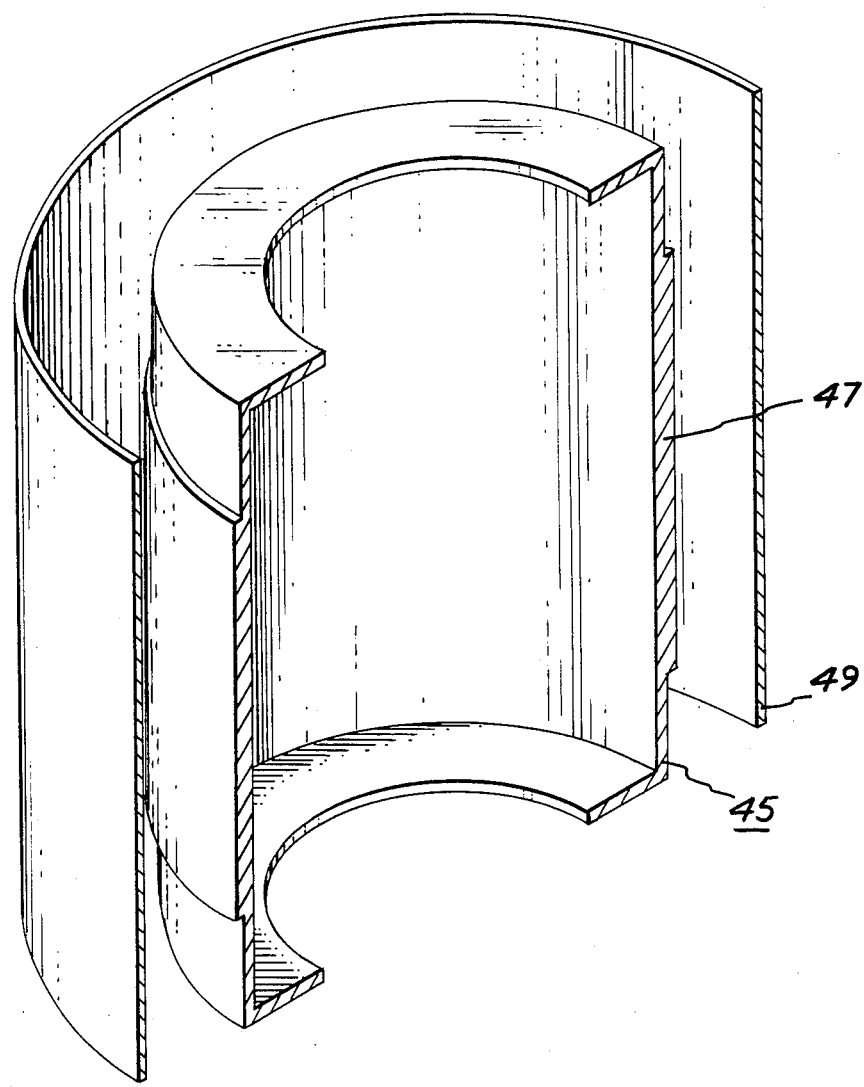
FIG. 8 is a sectional isometric view of a double feromagnetic shield for a magnetic resonance magnet in accordance with the present invention.
Figure 8B:
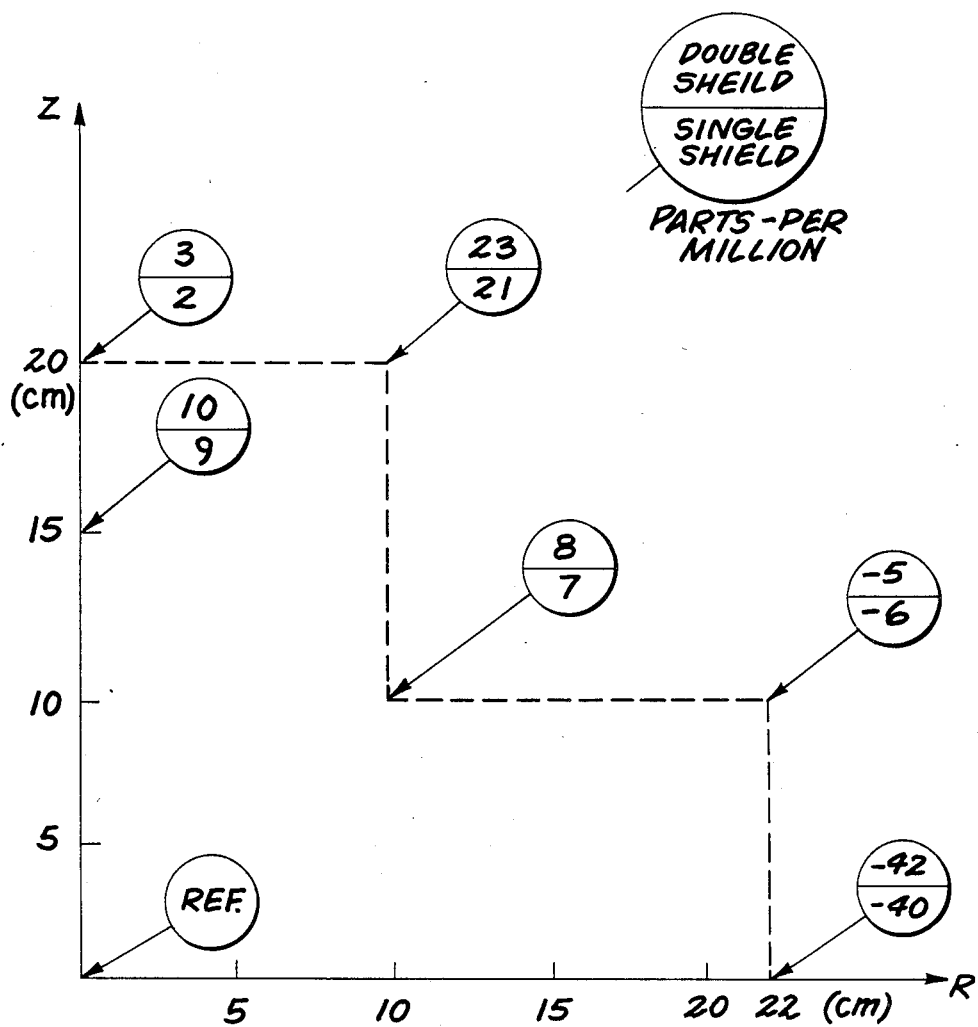

Referring now to FIG. 8 another embodiment of the present invention is shown. An inner cylindrical shell with end caps 45 is shown for situating around an MR magnet so that the longitudinal axis of the cylindrical shell and the magnetic axis of an MR magnet are coaxial. The inner shell is sized so that it can be in close proximity (approximately 10 cm, for example) all around the MR magnet. The inner cylindrical shell is of variable thickness, having a central portion 47 in the longitudinal direction thicker than the end portion of the shell. An outer cylindrical shell 49 without end caps surrounds the inner cylindrical shell and is coaxial therewith. The inner and outer shell can be fabricated of ferromagnetic material such as ingot iron or low carbon steel from rolled sheets welded together. Alternatively, the inner shell can be fabricated of variable thickness staves bolted to small and large diameter disks as shown in FIG. 1. The outer shell can be formed of curved longitudinal sections of ingot iron or low carbon steel joined together by splice plates.

For a 0.5T magnet the extent of the stray field gauss line can be reduced from 6.2 meters to 1.5 meters, for example, with a double field having the following dimensions.

| Inner Shield | |
| --- | --- |
| Inner radius of cylindrical shell | 100 cm |
| Axial length of cylindrical shell | 244 cm |
| Thickness of central portion of shell | 5 cm |
| Longitudinal extent of thicker central portion | 162 cm |
| Thickness of end caps and end portions of shell | 3 cm |
| Access hole radius in end caps | 65 cm |
| Spacing from the exterior of the MR magnet to the inner diameter is approximately 10 centimeters. | |
| Inner shield weight | 13,800 lbs. |
| Outer Shield | |
| Distance between inner and outer shells | 50 cm |
| Axial length of cylindrical shell | 244 cm |
| Thickness of shell | 1 cm |
| Outer shield weight | 4,100 lbs. |

In operation the inner shell carries as much of the flux generated by the MR magnet consistent with a weight optimized design. The weight optimized design requires the inner shell to be saturated with each part of the shield participating equally in diverting flux away from the external environment by using a variable thickness shield with a thicker shield where the amount of flux passing through the shield at that location is greater.

The outer shell is spaced apart from the inner shell at a distance sufficient to keep the flux passing through the inner shell to be diverted to the outer shell. The outer shell thickness is chosen so that it saturates during operation. The outer shell carries additional flux, reducing the five gauss line surrounding the magnet.

Perturbation to the working volume is reduced by situating the shield so that the longitudinal axis of the shield and the magnetic axis of the magnet are coaxial. The radial extent of the central aperture in each end cap is adjusted to copensate for the perturbation introduced by the cylindrical shields alone.

Figure 9A:
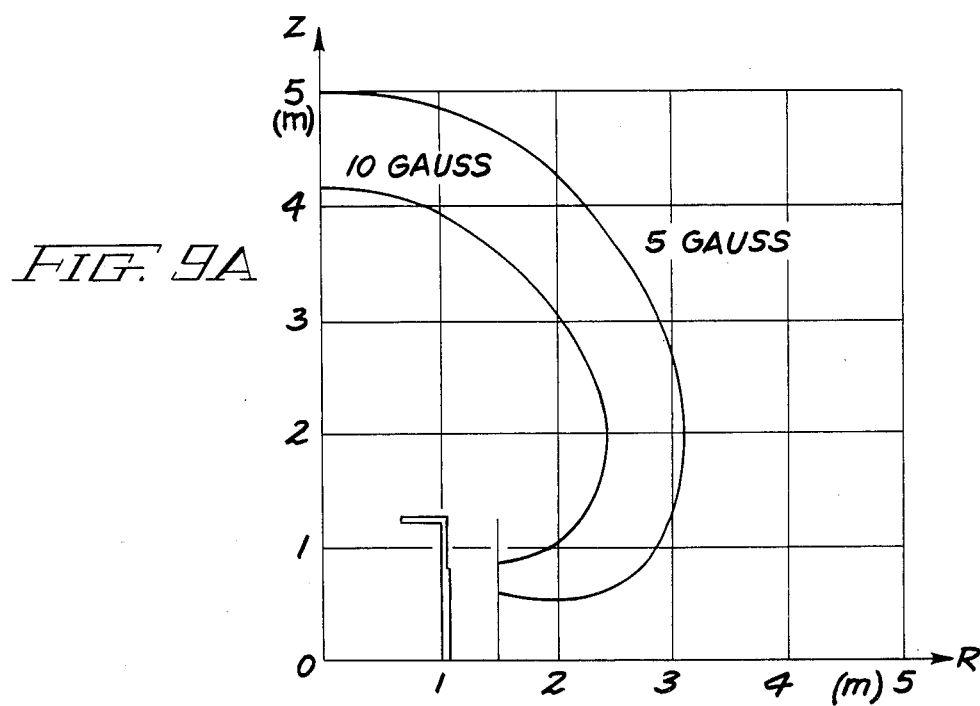
FIGS. 9A and B show the extent of the five and ten gauss stray field levels for a double (inner and outer shield) and single shield (inner shield only) configuration, respectively, of FIG. 8.
Figure 9B:
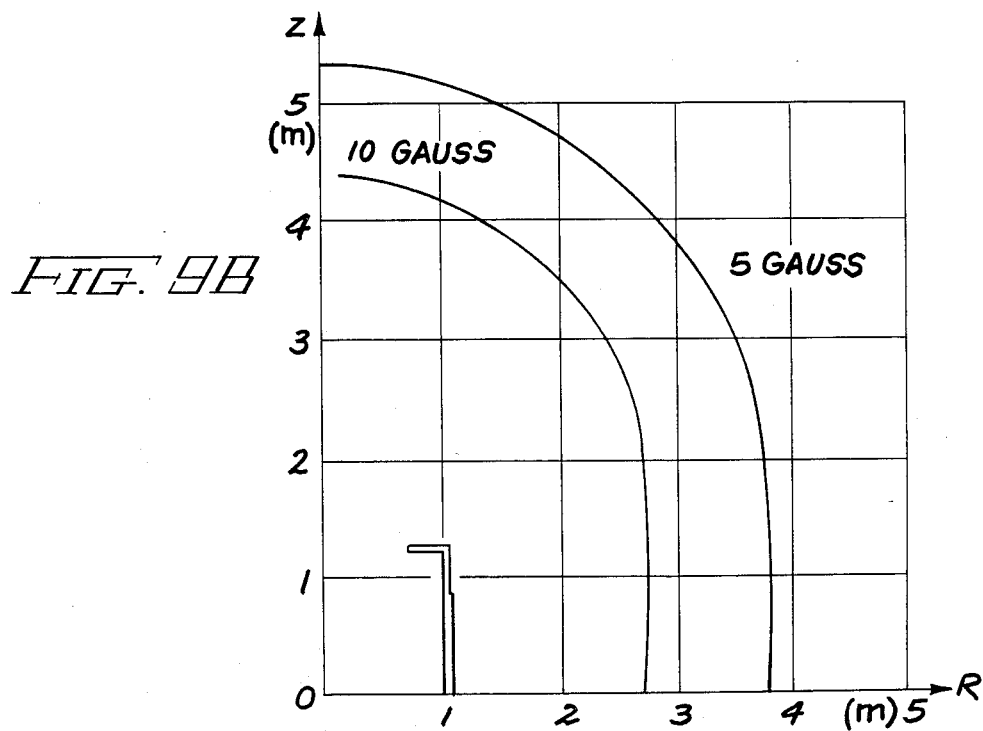

Referring now to FIGS. 9A and B, the extent of the five and ten gauss stray field levels is shown for the double (inner and outer cylindrical shell) and single shield (inner cylindrical shell only) configuration, respectively, for the dimensions previously given.

The perturbation in the working volume is shown in FIG. 10. Two values are given at each point in this figure corresponding to the single and double shield configurations. Analysis shows that the total inhomogeneity in the working volume can be reduced to two parts per million down from sixty five by the use of shimming currents not exceeding sixteen amperes.

The effect of including or removing the outer shield is seen to be only a two parts per million variation in a total peak-to-peak inhomogeneity of sixty five parts per million. This means that removal of the outer shield, where environmental conditions permit, has a negligible effect on the conditions inside the working volume. A single setting of the shim currents should be sufficient for the shield configuration of FIG. 8 whether it is single or double. The double shield configuration therefore gives an MR magnet added siting flexibility.

The foregoing describes a shield for an MR magnet which reduces the stray field using the least amount of ferromagnetic material while at the same time minimizing the effect of the shield on the field inhomogeneity in the working volume of the MR magnet.

While the invention has been particularly shown and described with reference to several preferred embodiments thereof, it will be understood by those skilled in the art that various changes in form and details may be made without departing from the spirit and scope of the invention.

What is claimed is:

1. A shield for a cylindrical magnet, the magnet defining an axially extending bore containing the working area of the magnet, said shell comprising:

a cylindrical shell of magnetic material surrounding the MR magnet, the cylindrical shell situated so that the longitudinal axis of the shell is coaxial with the magnetic axis of the MR magnet; and two disc shaped end caps of magnetic material secured to either end of the cylindrical shell, said end caps each defining a central aperture extending longitudinally through each disc, the radial extent of the apertures sized so that the perturbation of the field in the working area of the MR magnet due to the cylindrical shell is compensated.

2. The shield of claim 1 wherein the thickness in the radial direction of the cylindrical shell is greater in the central portion as measured in the longitudinal direction and decreases towards either end so that the cylindrical shell thickness is greater where the field density due to the MR magnet is high and less thick where the field density is lower.

3. The shield of claim 2 wherein said cylindrical shell has a radial thickness such that said cylindrical shell saturates during magnet operation.

4. A double shield for a cylindrical MR magnet, the magnet defining an axially extending bore containing the working area of the magnet, said double shield comprising:

an inner cylindrical shell of magnetic material surrounding the MR magnet, the cylindrical shell situated so that the longitudinal axis of the shell is coaxial with the magnetic axis of the MR magnet;

two disc shaped end caps of magnetic material secures to either end of the cylindrical shell, said end caps each defining a central aperture extending longitudinally through each disc, the radial extent of apertures sized so that the perturbation of the field in the working area of the MR magnet due to the cylindrical shell is compensated; and an outer cylindrical shell of magnetic material spaced away from and surrounding said inner cylindrical shell and coaxial with said inner shell.

5. The shield of claim 4 wherein the thickness in the radial direction of the inner cylindrical shell is greater in the central portion as measured in the longitudinal direction and decreases towards either end so that the cylindrical shell thickness is greater where the field density due to the MR magnet is high and less thick where the field density is lower.

6. The shield of claim 4 wherein said inner cylindrical shell saturates during operation.

7. The shield of claim 6 wherein said outer cylindrical shell is spaced apart from said inner shell so that during magnet operation the flux passing through said inner shell is not diverted to the outer cylindrical shell.

8. The shield of claim 7 wherein said outer cylindrical shell has a radial thickness such that said outer cylindrical shell saturates during magnet operation.

* * * * *